United States Patent
Carlson

(10) Patent No.: US 8,343,317 B2
(45) Date of Patent: Jan. 1, 2013

(54) IN SITU CLEANING OF CVD SYSTEM EXHAUST

(75) Inventor: David K. Carlson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 874 days.

(21) Appl. No.: 12/244,318

(22) Filed: Oct. 2, 2008

(65) Prior Publication Data

US 2009/0044699 A1   Feb. 19, 2009

Related U.S. Application Data

(62) Division of application No. 11/435,065, filed on May 16, 2006.

(51) Int. Cl.
*B01J 19/08* (2006.01)

(52) U.S. Cl. .... 204/157.3; 134/1; 423/210; 422/186.04; 422/186.3

(58) Field of Classification Search ................ 95/29, 31; 423/168, 210; 134/1, 1.3, 32, 34, 902
See application file for complete search history.

(56) References Cited

U.S. PATENT DOCUMENTS

| | | | |
|---|---|---|---|
| 4,263,872 A * | 4/1981 | Ban ........................... | 118/721 |
| 4,263,873 A * | 4/1981 | Christianson ............... | 119/172 |
| 4,608,063 A | 8/1986 | Kurokawa | |
| 4,960,488 A | 10/1990 | Law et al. | |
| 5,158,644 A | 10/1992 | Cheung et al. | |
| 5,451,378 A | 9/1995 | Russell et al. | |
| 5,454,903 A | 10/1995 | Redeker et al. | |
| 5,788,778 A | 8/1998 | Shang et al. | |
| 5,811,022 A | 9/1998 | Savas et al. | |
| 5,827,370 A | 10/1998 | Gu | |
| 5,833,290 A | 11/1998 | Curelop et al. | |
| 5,916,369 A | 6/1999 | Anderson et al. | |
| 5,963,833 A | 10/1999 | Thakur | |
| 6,042,654 A * | 3/2000 | Comita et al. ............... | 134/2 |
| 6,045,618 A * | 4/2000 | Raoux et al. ................ | 118/715 |
| 6,083,323 A | 7/2000 | Carlson et al. | |
| 6,190,458 B1 | 2/2001 | Harada | |
| 6,194,628 B1 | 2/2001 | Pang et al. | |
| 6,254,686 B1 | 7/2001 | Comita et al. | |
| 6,255,222 B1 * | 7/2001 | Xia et al. ..................... | 438/710 |
| 6,368,567 B2 | 4/2002 | Comita et al. | |
| 6,467,491 B1 * | 10/2002 | Sugiura et al. ............... | 134/1.3 |
| 6,572,924 B1 | 6/2003 | Halpin | |

(Continued)

FOREIGN PATENT DOCUMENTS

EP    1 145 759 A1   10/2001

(Continued)

OTHER PUBLICATIONS

"USPTO Final Office Action mailed Jan. 7, 2009 for U.S. Appl. No. 11/435,065, filed May 16, 2006", 10 pgs.

(Continued)

*Primary Examiner* — Duane Smith
*Assistant Examiner* — Ives Wu
(74) *Attorney, Agent, or Firm* — Diehl Servilla LLC

(57) ABSTRACT

Embodiments of the invention relate to methods and apparatuses for forming films using CVD. One or more method and apparatus embodiments include preventing the formation of bonds and/or breaking bonds that permit polymers to form in an exhaust line of a CVD apparatus.

15 Claims, 7 Drawing Sheets

U.S. PATENT DOCUMENTS

| | | | |
|---|---|---|---|
| 6,689,930 B1 * | 2/2004 | Pang et al. | 134/1.1 |
| 6,715,496 B2 | 4/2004 | Kwan et al. | |
| 6,815,633 B1 * | 11/2004 | Chen et al. | 219/121.54 |
| 6,902,629 B2 | 6/2005 | Zheng et al. | |
| 6,923,189 B2 | 8/2005 | Lakshmanan et al. | |
| 6,979,368 B2 | 12/2005 | Park | |
| 6,981,508 B2 | 1/2006 | Shang et al. | |
| 7,084,832 B2 * | 8/2006 | Pribyl | 343/866 |
| 2001/0008618 A1 * | 7/2001 | Comita et al. | 423/210 |
| 2003/0164225 A1 | 9/2003 | Sawayama et al. | |
| 2004/0020598 A1 | 2/2004 | Itatani et al. | |
| 2005/0145173 A1 * | 7/2005 | Holber et al. | 118/723 E |
| 2008/0142729 A1 * | 6/2008 | Chen | 250/424 |

FOREIGN PATENT DOCUMENTS

| | | | |
|---|---|---|---|
| EP | 1145759 B1 * | 4/2004 | |
| JP | 09-181063 | 7/1997 | |
| JP | 2000-317265 | 11/2000 | |
| WO | WO 99/44760 | * | 9/1999 |
| WO | WO-99/44760 | | 9/1999 |
| WO | WO-02/00962 | | 1/2002 |

OTHER PUBLICATIONS

USHIO Brochure from Website—Medium-Pressure Mercury-ARC Lamps—Data Unknown.

PCT International Search Report for PCT/US2007/068948, (Oct. 15, 2008), 7 pp.

PCT Written Opinion for PCT/US2007/068948, (Oct. 15, 2008), 9 pp.

"Machine Translation of JP-09-181063" 22 pages.

"Machine Translation of JP-2000-317265" 11 pages.

* cited by examiner

IN SITU CLEANING OF CVD SYSTEM EXHAUST

CROSS-REFERENCE TO RELATED APPLICATIONS

This application is a divisional of U.S. patent application Ser. No. 11/435,065, filed on May 16, 2006, the contents of which is specifically incorporated by reference herein in its entirety.

FIELD OF THE INVENTION

Embodiments of the present invention generally pertain to cleaning of chemical vapor deposition (CVD) exhaust systems and more specifically to in situ cleaning of polymeric contaminants in CVD systems.

BACKGROUND OF THE INVENTION

During CVD processing, deposition gases are released inside a processing chamber to form a thin film layer on the surface of a substrate being processed. Unwanted deposition on areas such as the walls of the processing chamber also occurs during such CVD processes. Because the residence time in the chamber of individual molecules in these deposition gases is relatively short, however, only a small portion of the molecules released into the chamber are consumed in the deposition process and deposited on either the wafer or chamber walls.

During semiconductor manufacturing processes in which CVD is utilized to form layers on wafers, it would be ideal if the injected process gas would deposit only on the wafer substrate surface, however, in reality, some gas molecules miss the substrate surface and deposit on the process chamber surfaces. Some of the unconsumed gas molecules are pumped out of the chamber along with partially reacted compounds and reaction byproducts through an exhaust line under vacuum. Many of the compounds in this exhausted gas are still in highly reactive states and/or contain residues or particulate matter that can form unwanted deposits in the exhaust line. In a processing chamber such as an Epi Centura® chamber manufactured by Applied Materials, the temperature of process gases falls dramatically upon exit from the processing chamber as the process gases enter the exhaust line, resulting in coating of the exhaust inserts, exhaust cap, and at least the first four feet of the exhaust line. In addition to the materials described above, the coating has been observed to be generally a translucent viscous liquid, with a honey-like consistency. The condensed exhaust byproduct can also appear opaque white to opaque yellow to opaque reddish brown, depending upon the process conditions and location in the exhaust line. When the condensed exhaust byproduct is opaque, it appears to be in a solid phase. It is believed that the translucent liquid reacts immediately on exposure to the ambient to form an opaque white material.

Thus the buildup of liquid and solid material in the exhaust lines poses several problems. First, the build-up poses a safety threat in that the matter is often a pyrophoric substance that may ignite when the vacuum seal is broken and the exhaust line is exposed to ambient conditions during standard, periodic cleaning operations. Second, if enough of the deposition material builds-up in the exhaust line, the exhaust line and/or its associated vacuum pump may clog if it is not appropriately cleaned. Even when periodically cleaned, matter build-up interferes with normal operation of the vacuum pump and can drastically shorten the useful life of the pump. Also, the solid matter may backwash from the exhaust line into the processing chamber and contaminate the processing chamber. If the translucent liquid is rapidly exposed to air, an explosive reaction can occur.

To avoid these problems, the inside surface of the exhaust line is regularly cleaned to remove the deposited material. This procedure is performed during a standard chamber clean operation that is employed to remove unwanted deposition material from the chamber walls and similar areas of the processing chamber. Common chamber cleaning techniques include the use of an etching gas, such as fluorine, to remove the deposited material from the chamber walls and other areas. The etching gas is introduced into the chamber and a plasma is formed so that the etching gas reacts with and removes the deposited material from the chamber walls. Such cleaning procedures are commonly performed between deposition steps for every wafer or a number of wafers.

Removal of deposition material from chamber walls is relatively straight forward in that the plasma is created within the chamber in an area proximate to the deposited material. Removal of deposition material from the exhaust line is more difficult because the exhaust line is downstream from the processing chamber. In a fixed time period, most points within the processing chamber come in contact with more of the etchant fluorine atoms than do points within the exhaust line. Thus, in a fixed time period, the chamber may be adequately cleaned by the clean process while residue and similar deposits remain in the exhaust line.

To attempt to adequately clean the exhaust line, the duration of the clean operation must be increased. Increasing the length of the clean operation, however, is undesirable because it results in equipment downtime, which adversely affects wafer throughput. Also, such residue build-up can be cleaned only to the extent that reactants from the cleaning process are exhausted into the exhaust line in a state that they may react with the residue in the exhaust line. In some systems and applications, the residence time of the exhausted reactants is not sufficient to reach the end or even middle portions of the exhaust line. In these systems and applications, residue build-up is even more of a concern.

Several different devices have been designed to facilitate the cleaning of such exhaust lines. One approach that has been employed to clean the exhaust line is to trap the particulate matter present in the exhaust stream before it reaches the vacuum pump by diverting gas flow into a collection chamber from which particulate matter cannot easily escape. Devices that rely on this technique provide a removable door or similar access to the collection chamber so that once a sufficient amount of material has built up within the chamber it can be easily removed. Typically, the substrate deposition system is temporarily shut off during the period in which the collection chamber is cleaned, thereby limiting or reducing wafer throughput of the system.

One approach that has been employed to clean the exhaust line relies on a scrubbing system that uses plasma enhanced CVD techniques to extract reactive components in the exhaust gas as film deposits on electrode surfaces. The scrubbing system is designed to maximize the removal of reactants as a solid film and uses large surface area spiral electrodes. The spiral electrodes are contained within a removable canister that is positioned near the end of the exhaust line between the blower pump and mechanical pump. After a sufficient amount of solid waste has built up on the electrodes, the canisters may be removed for disposal and replacement.

Problems exist in this prior art method in that the system relies on the large surface area of the electrodes to provide an area for deposited solid matter to collect. To accommodate the large surface area of the electrodes, the system is necessarily large and bulky. Furthermore, extra expenses are incurred in the operation of this prior art scrubber system since the removable canister is a disposable product that must be replaced and properly disposed. Also, the scrubbing system is located downstream from a beginning portion of the vacuum exhaust line and thus does not ensure removal of powdery material or particulate matter that builds-up in this portion of the line.

Another approach to cleaning the exhaust lines utilizes what is sometimes referred to as a point of use reactor. The point of use reactor uses a heater cartridge to react excess gas from the process chamber. The maximum temperature of the point of use reactor is about 500° C., and reaction byproducts remain in the exhaust line. The point of use reactor is not effective for reduced pressure deposition since the polysilicon formation causes significant particle formation.

Still another method and apparatus for cleaning the exhaust line involves trapping powder residue and other particulate matter in a collection chamber and removing the same with a plasma formed downstream of the reaction chamber. Constituents from the plasma react to form gaseous products that are readily pumped through and out the exhaust line. The conversion process relies on forming a plasma from an etchant gas in the area where the particles are trapped, and this type of apparatus is sometimes referred to as a Downstream Plasma Apparatus or "DPA" for short. Several examples of such an apparatus and method are described in commonly assigned U.S. Pat. No. 6,194,628, which is incorporated herein by reference in its entirety. One embodiment of the apparatus described in U.S. Pat. No. 6,194,628 includes a coil surrounding a gas passageway defined by a vessel chamber. The coil is connected to an RF power supply that is used to excite molecules from particulate matter and residue within the passageway into a plasma state. The RF power in a commercial version of such an apparatus utilizes high frequency RF power with a fluorine-containing gas such as nitrogen trifluoride to chemically etch the exhaust deposit. The upper limit of the frequency range of the power supply described in U.S. Pat. No. 6,194,628 is listed as 200 MHz, and the frequency used in experimental setup in U.S. Pat. No. 6,194,628 is 13.56 MHz. A potential problem with the use of a fluoride-containing gas is compatibility with materials in the reactor, disposal of hazardous waste generated by the cleaning process, and damage to the equipment if proper controls are not employed.

Accordingly, it would be desirable to provide methods and apparatus for efficiently and thoroughly cleaning the exhaust line in a semiconductor processing systems.

SUMMARY OF THE INVENTION

Embodiments of the invention relate to methods and apparatus for cleaning the exhaust line of a CVD processing chamber, for example, a semiconductor processing chamber. Other embodiments pertain to CVD processing apparatus and methods that include a cleaning device.

In one embodiment, a CVD apparatus is provided which comprises a CVD reaction chamber including a substrate support and a gas distribution system for introducing gases into reaction chamber; an exhaust line connected to the reaction chamber for removing gases from the process chamber; and a device for preventing the formation of polymers in the exhaust line. In one or more embodiments, the device comprises an RF chamber. The RF chamber may be adapted to produce temperatures sufficient to break or prevent bonds that form polymers. The device may further include a source of etchant gas and an etchant gas input into the RF chamber. In other embodiments, the device for preventing the formation of polymers in the exhaust line includes a UV light source.

Other embodiments of the invention pertain to methods of preventing the formation of polymers in the exhaust line of a CVD reaction chamber comprising flowing gases exhausted from the CVD reaction chamber through a downstream chamber which generates energy to break bonds and/or prevent bonds that form polymers, thereby preventing the formation of polymeric species in the exhaust line. The device may include a low frequency RF chamber which is adapted to generate temperatures sufficient to break and/or prevent bonds that form polymeric species in the exhaust line. Alternatively, the device may include a UV light source.

DETAILED DESCRIPTION OF THE INVENTION

Before describing several exemplary embodiments of the invention, it is to be understood that the invention is not limited to the details of construction or process steps set forth in the following description. The invention is capable of other embodiments and of being practiced or being carried out in various ways.

Aspects of the present invention provide methods and apparatus for chemical vapor deposition. Certain embodiments relate to semiconductor processing apparatus and methods. Specific embodiments pertain to methods and apparatus for cleaning an exhaust line of a chemical vapor deposition apparatus, for example a CVD reaction chamber of a semiconductor processing apparatus. In one or more embodiments, an apparatus for breaking and/or preventing the formation of bonds of exhaust components to prevent the polymerization of exhaust components is provided downstream from the reaction chamber. In a first embodiment, a low frequency RF chamber is located adjacent the exhaust cap of the deposition system and downstream from the reaction chamber. The downstream RF chamber prevents the formation of polymeric species in the exhaust line using heat alone or in combination with etchant species. In certain embodiments, a low pressure plasma can be generated to assist in the cleaning of the exhaust line. In another embodiment, UV energy can be utilized adjacent the exhaust cap of the deposition system and downstream of the reaction chamber to prevent the polymerization of chemicals in the exhaust line. The UV energy can be used alone or together with etchant species. In certain embodiments, a low pressure plasma can be utilized with the UV energy to assist in cleaning of the exhaust line.

A typical semiconductor processing chamber and operations that can be utilized with the cleaning apparatus and methods described herein will now be described. It will be understood that the processing chamber and operations described herein are exemplary only, and other types of processing chambers and operations can be used with the cleaning methods and apparatus described herein. The apparatus and methods of the present invention can be used in conjunction with a variety of different semiconductor processing apparatus.

Figure 1:
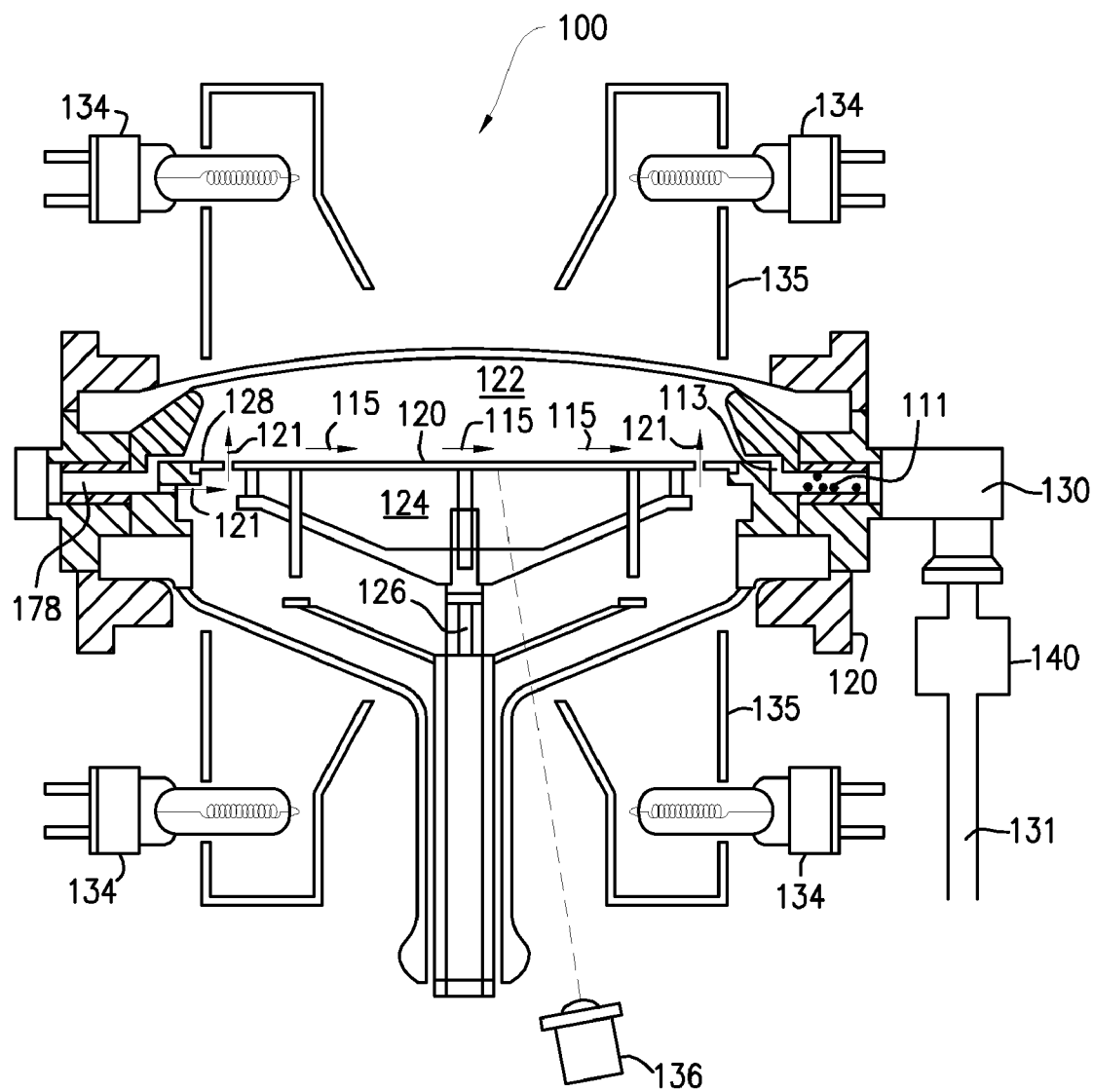
FIG. 1 illustrates an embodiment of the present invention including an exhaust line cleaning apparatus.
Figure 2:
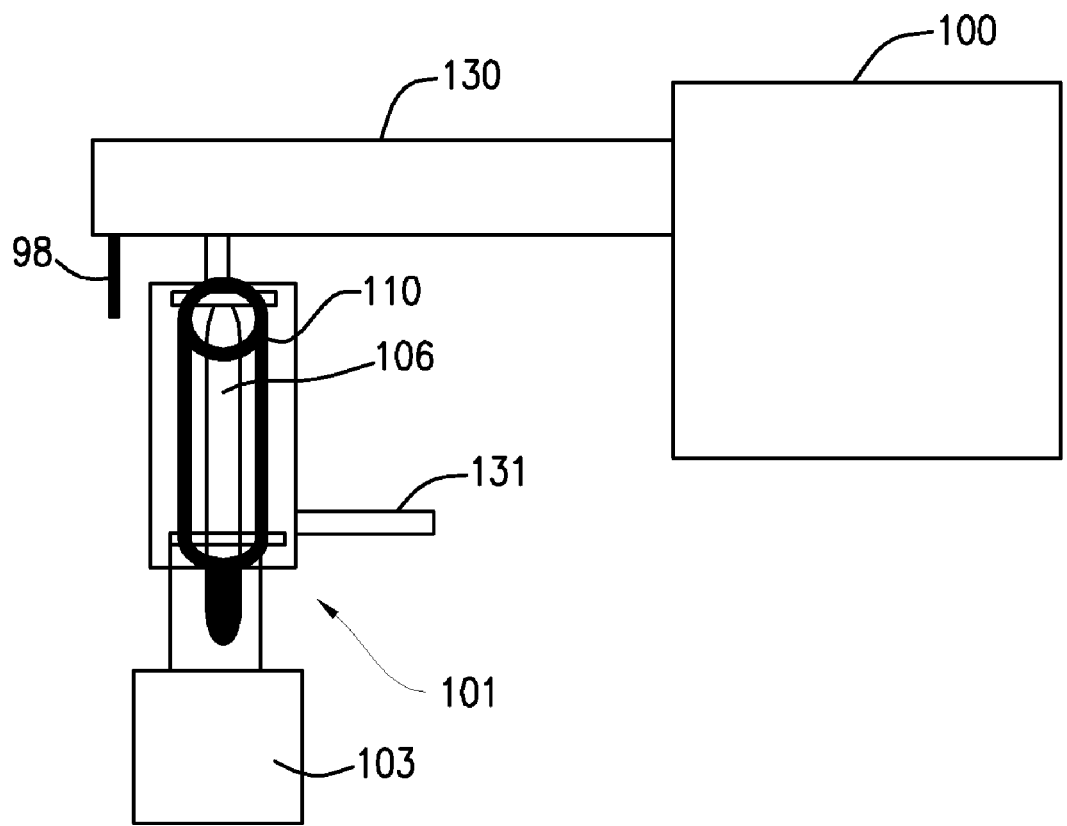
FIG. 2 illustrates an embodiment of an exhaust line cleaning apparatus utilizing a heating system.

One suitable device, a single wafer processor in which one wafer at a time is processed in a processing chamber, is shown in FIG. 1. A susceptor 120 divides a chamber 100 into one portion which is below the susceptor (the lower portion) 124, and a second portion which is above the susceptor (the upper portion) 122. The susceptor 120 is generally mounted on a shaft 126 which rotates the susceptor about its center to achieve a more uniform processing of the wafer. A flow of a processing gas, such as a deposition gas 115, is provided in the upper portion 122 of the chamber. The chamber generally has a gas inlet passage 178 at one side thereof, and a gas exhaust passage 113 at an opposite side to achieve a flow of the processing gas across the wafer. The susceptor 120 is heated in order to heat the wafer to a desired processing temperature. According to certain embodiments, one method used to heat the susceptor is by the use of lamps 134 provided around the chamber and directing their light into the chamber and onto the susceptor 120. In order to control the temperature to which the wafer is being heated, the temperature of the susceptor is constantly measured. This is often achieved by an infrared temperature sensor 136 which detects the infra-red radiation emitted from the heated susceptor. Reflectors 135 may also be provided to reflect light into the chamber.

A flow of an inert gas 121, such as hydrogen, may be provided into the lower portion of the chamber at a pressure slightly greater than that of the deposition gas in the upper portion of the chamber to prevent deposits of material on the back surface of the susceptor. One apparatus for achieving this is described in the application for U.S. Pat. No. 5,916,369 of Roger N. Anderson et al., entitled "Gas Inlets For Wafer Processing Chamber". Since the inert gas in the lower portion of the chamber is at a higher pressure, it will flow around the edge of the susceptor from the lower portion of the chamber and into the upper portion of the chamber. This flow of the inert gas prevents the flow of the deposition gas 115 into the lower portion of the chamber.

The above reactor description is mainly for illustrative purposes, and the present invention may be used with other CVD equipment such as electron cyclotron resonance (ECR) plasma CVD devices, induction coupled RF high density plasma CVD devices, or the like. The present invention may also be used with thermal CVD devices, plasma etching devices and physical vapor deposition devices. The apparatus of the present invention and the methods for preventing deposition build-up within an exhaust line is not limited to any specific semiconductor processing apparatus or to any specific deposition or etching process or method.

During semiconductor processing operations such as chemical vapor deposition processes carried out by CVD reactor 100, a variety of gaseous waste products and contaminants are exhausted from chamber 100 into exhaust line 131. As noted above, as deposition gas 115 exits the chamber through exhaust passage 113, the deposition gas cools and condenses to form exhaust products 111 within the exhaust passage 113. These exhaust products 111 are also deposited in the exhaust cap 130 and exhaust line 131. Depending on the particular operation being performed, these exhaust products 111 may include polymeric material and particulate matter such as partially reacted products and byproducts that leaves a residue or similar powdery material within the exhaust line 131 as it is exhausted through the exhaust line. For example, during the deposition of a silicon nitride film using silane ($SiH_4$), nitrogen ($N_2$) and ammonia ($NH_3$) as precursors, residue in the form of a brown powder composed of $Si_xN_yH_z$, $Si_xH_y$, $SiO_x$ and elemental silicon has been observed in the exhaust line. It is believed that this residue build-up is from half-reacted byproducts of the reaction of $SiH_4+N_2+NH_3$. Similar residues are also formed during the deposition of silicon nitride layers using other precursor gases or liquids such as disilane ($Si_2H_6$) or organic sources. Residue build-up may also occur during the deposition of oxynitride films and silicon oxide films among other layers and may also occur during plasma etching and other process steps. Viscous material that has not been exposed to air has been observed to be composed of chlorosilane polymers when they are not exposed to air. These polymers react with water to form siloxane polymers. When exposed to air, the viscous liquid condenses into solid residue, examples of which are described above.

Embodiments of the present invention prevents build-up of such residues and particulate matter by breaking and/or preventing bonds and prevent polymerization of the components in the reactant gases exhausted through the vacuum exhaust line. Embodiments of the invention can be utilized with a low pressure plasma to assist in cleaning of the exhaust line.

Still referring to FIG. 1 CVD reactor 100 is fitted with a bond breaking or bond prevention apparatus 140 according to one or more embodiments of present invention. The bond breaking or bond prevention apparatus 140, which reduces and/or prevents polymerization of species that form polymers in the exhaust line, is positioned downstream from the exhaust gas source, the processing chamber 100. The apparatus 140 may either connect to or replace a portion of the exhaust line 131.

In FIG. 1, a bond breaking or bond prevention apparatus 140 (hereinafter referred to as "polymer prevention apparatus") for breaking or preventing the formation of polymers in the exhaust line 131 is fitted between vacuum pump system and vacuum manifold along a portion of exhaust line 131. Because of its position, gases exhausted from vacuum chamber 100 necessarily pass through polymer prevention apparatus 140. Polymer prevention apparatus 140 may be positioned at any location along exhaust line 131, but preferably, polymer prevention apparatus 140 is positioned as close as possible to exhaust cap 130 so that gases exhausted from chamber 100 pass through polymer prevention apparatus 140 before passing through any portion of exhaust line 131.

In operation, as deposition gases are exhausted from vacuum chamber through exhaust line 131, polymer prevention apparatus 140 operates to break bonds or prevent formation bonds that would allow the formation of polymeric species in the exhaust line, thereby preventing the formation of such polymeric species in the exhaust line 131. To prevent polymer formation, polymer prevention apparatus 140 may be turned ON during both deposition and clean operations or may be activated only during the clean procedure.

Specific embodiments of the polymer prevention apparatus will now be described. Referring first to FIGS. 2-5, polymer prevention apparatus may include a downstream high temperature chamber 101 attached to exhaust cap 130. In the embodiment shown, the downstream high temperature chamber 101 may be a low frequency RF chamber. As used herein, low frequency means an RF frequency of less than about 20 KHz, and typically less than about 10 KHz. The RF chamber is capable of generating temperatures sufficient to break or prevent bonds that form polymers in the exhaust line. Temperatures sufficient to break or prevent bonds that form polymers exceed about 1000° C., typically exceed 1050° C., and more typically are in the rage of about 1100° C. to about 1200° C.

Figure 3:
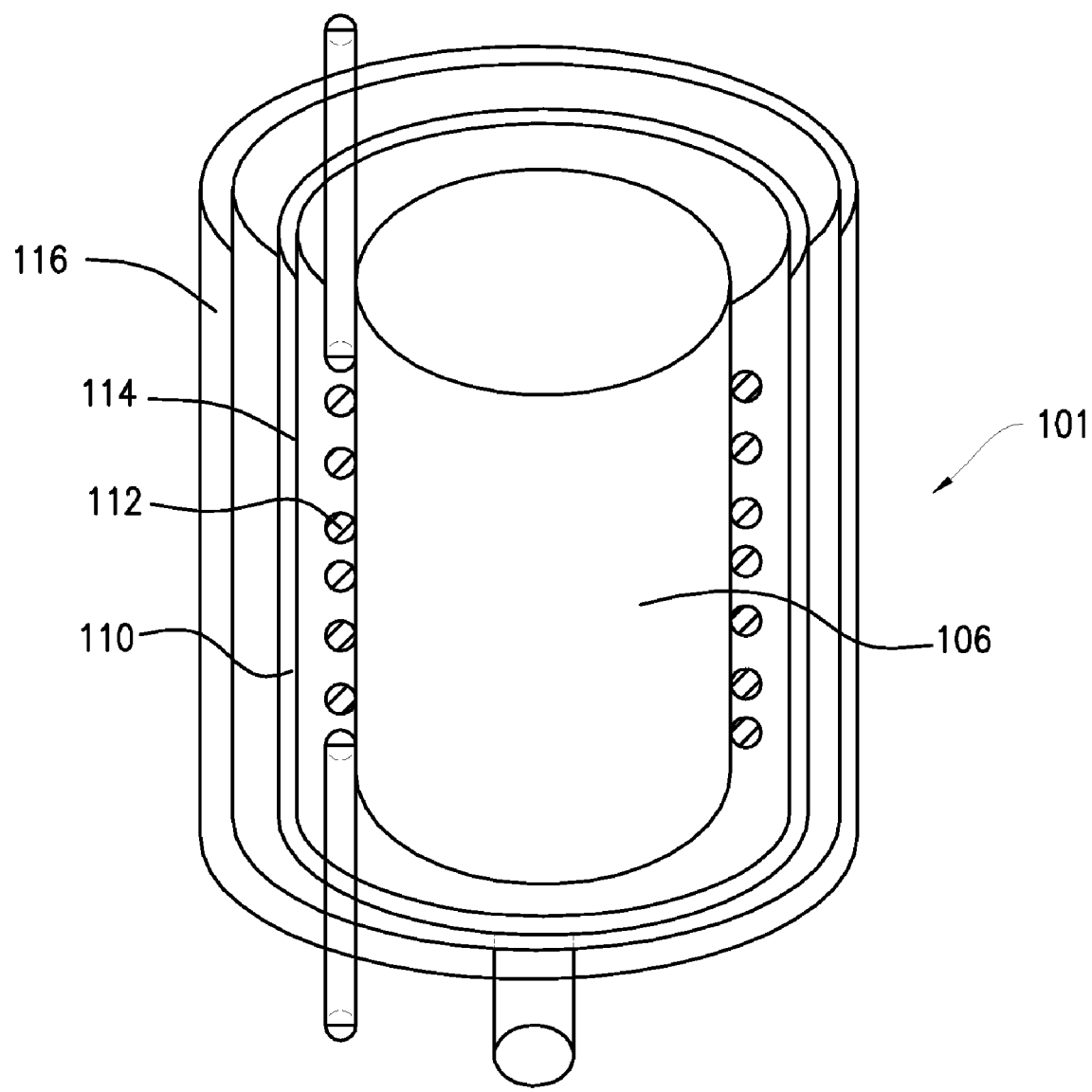
FIG. 3 is a side cross-sectional view of the exhaust cleaning apparatus shown in FIG. 2.
Figure 4:
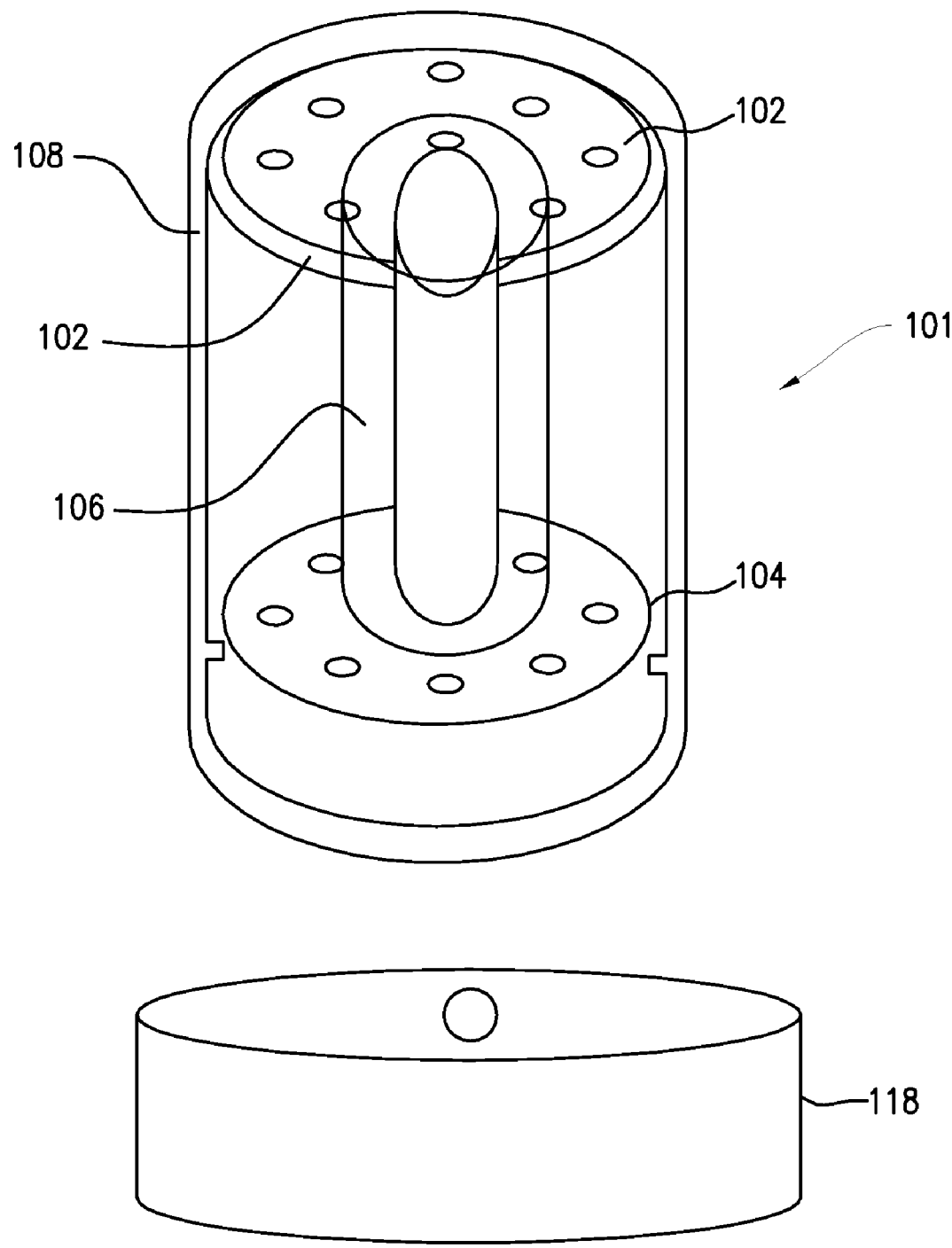
FIG. 4 is a top cross-sectional view of the exhaust cleaning apparatus shown in FIG. 2.
Figure 5:
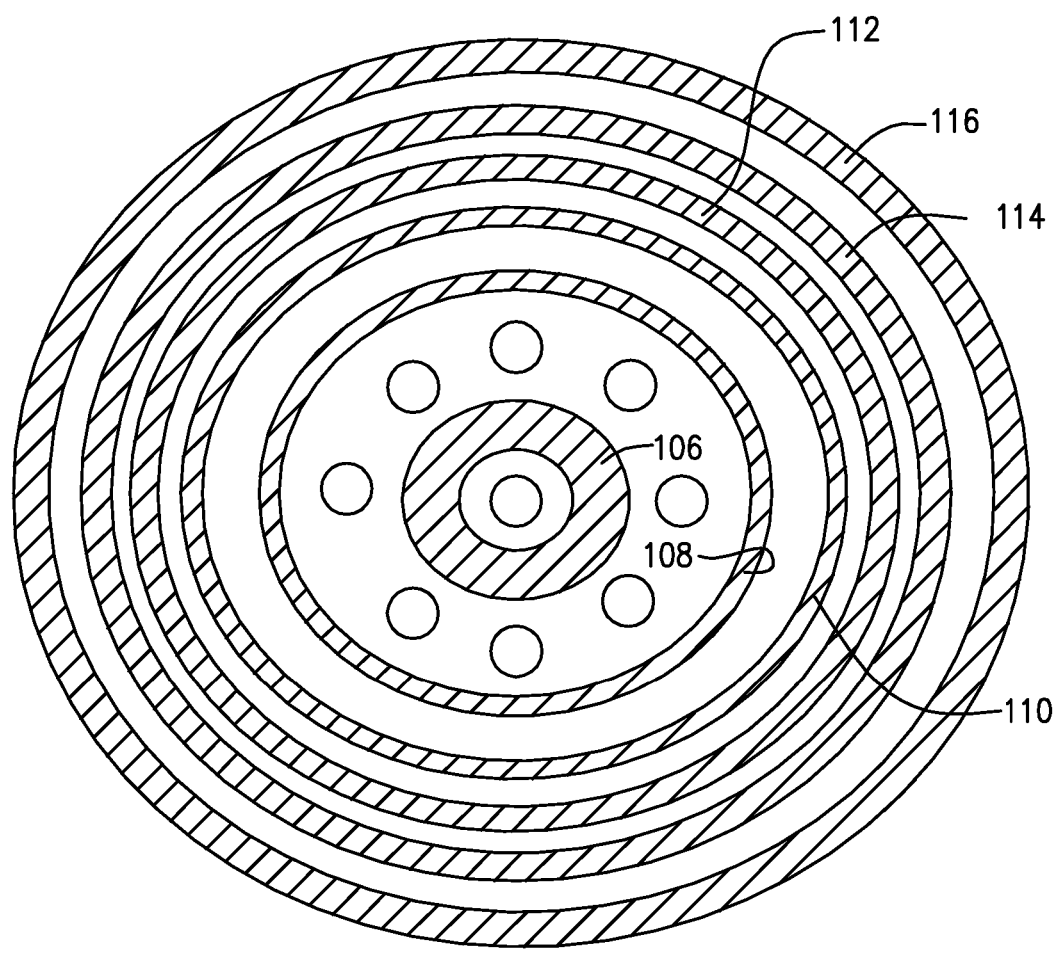
FIG. 5 is a side-view of the apparatus shown in FIG. 2.

Components of the high temperature chamber 101 include top baffle 102 and bottom baffle 104, which may be made from SiC or any other suitable material, which sandwich and support a graphite susceptor tube 106 surrounded by a first clear quartz liner 108, which is shown in FIGS. 3 and 4. Referring to FIGS. 3 and 5, a second opaque quartz liner 110 surrounds clear quartz liner 108. A suitable coil 112 for example, a nickel plated copper coil, for generating low frequency RF, energy surrounds the opaque quartz liner 110. A ceramic liner 114 surrounds the coil 112, and the ceramic liner is surrounded by a stainless steel liner 116. The stainless steel line 116 serves at least two purposes. First, it shields CVD processing apparatus 100 and other equipment from the voltage and noise signals generated by the coil. Second, if ceramic liner 114 were to break or crack or if the vacuum seal chamber 101 is broken in another manner, liner 116 provides a second seal preventing the exhaust gases from escaping. Liner 116 can be made out of a variety of metals such as aluminum or steel or other compounds and is preferably grounded for shielding effect. As shown in FIG. 5, an opaque quartz radiation baffle 118 may be provided at the outlet portion of downstream high temperature chamber 101 to provide thermal isolation.

It will of course be understood that the details of the downstream high temperature chamber 101 provided above are an exemplary embodiment only, and variants of the design may be utilized. The details of operation of a low frequency RF chamber to generate temperatures sufficient to break or prevent bonds that form polymers in the exhaust line can be determined experimentally. High temperature RF chambers that can achieve temperatures between about 1000° C. and 1200° C. are known in the art.

The voltage field created within downstream high temperature chamber 101 to form the plasma can be generated using a variety of known methods such as capacitively coupled electrodes, inductively coupled coils or ECR techniques. Because of its compact size and capacity to create relatively high voltage fields, it is preferable, however, to create the voltage field with an inductive coil such as a helical resonator coil. Such coils are well known to those of ordinary skill in the art and may be designed according to criteria set forth in any of a number of well known textbooks such as Michael A. Lieberman and Allan J. Lichtenberg, "Principles of Plasma Discharges and Materials Processing," pp. 404-410 John Wiley & Sons (1994), which is hereby incorporated by reference.

The helical resonator coil can be made out of a high conductivity type metal such as copper, nickel, or gold or similar conducting material. To properly resonate the coil, it is important that the length of the coil be about or slightly longer than ¼ of the wavelength of the applied RF signal. A coil of this length creates a stronger and more intense voltage field that further enhances decomposition of species in the high temperature chamber 101.

The helical resonator coil is connected at one end to an RF power supply and at the opposing end to a ground potential. To ensure complete reaction of material passing through and/or deposited within downstream high temperature chamber 101, the high temperature chamber 101 must be driven by the RF power supply at a level sufficient to heat the graphite tube to a temperature above about 1000° C. and to optionally form a low frequency plasma. Generally, a power level of between 50-1000 Watts or more can be employed, and preferably a power level of between 100-400 Watts is used. The actual power level selected should be determined by balancing a desire to use a sufficient power level to form low frequency plasma and a desire to use a low power level to save energy costs and allow use of smaller, less expensive power supplies.

The power supply driving high temperature chamber 101 is operated at a frequency range below about 10 KHz. At this frequency range, higher ion bombardment is provided to further aid in cleaning of the exhaust line.

RF power supply can be supplied from either a single frequency RF source or a mixed frequency RF source. The power output of the supply will depend on the application for which the downstream high temperature chamber 101 is used and on the volume of the gas to be treated in the downstream high temperature chamber 101. RF power can be derived from RF power supply used to power the reaction chamber 100 or can be supplied by a separate RF power supply 103 that drives only polymer prevention apparatus 140. Additionally, assuming multiple processing chambers are present in a clean room, the multiple downstream high temperature chambers 101 connected to the reaction chamber 100 may all be driven by a separate, dedicated RF power supply that is connected to an appropriate number of RF power splitters.

The length and size of the downstream high temperature chamber 101 can vary. In some applications, the high temperature chamber can be only 4-6 inches long or even shorter, while in other applications, the downstream high temperature chamber 101 can be the entire length of exhaust line 131 (4-5 feet or longer) thus replacing the line. Because the length of the coil should be slightly longer than ¼ of the RF wavelength, there is a direct relationship between the coil length and RF frequency used. Longer coils require lower frequency RF power signals.

The downstream high temperature chamber 101 described above can be utilized in a thermal mode alone to clean the exhaust line or it may also be used together with a low pressure plasma that can be generated in the low frequency RF chamber. As used herein, low pressure refers to a pressure of less than about 20 Torr, and typically less than about 10 Torr. In addition, various etchant species such as HCl, $NF_3$, $Cl_2$ and $F_2$ can be activated to augment the cleaning process. Etchant species can be introduced into an inlet port 98 in communication with the exhaust cap 130.

The use of chlorine containing gases to clean post deposition deposits from a wafer processing chamber is described in U.S. Pat. No. 6,042,654, the entire content of which is incorporated herein by reference. In the method described in U.S. Pat. No. 6,042,654, chlorine radicals are formed by heating chlorine gas and the chlorine radicals are reacted with deposits in the processing chamber.

An advantage of the high temperature cleaning process and apparatus is that HCl can be used as a cleaning gas at the higher temperatures. In one embodiment, when HCl is used as the etchant species, the downstream high temperature chamber 101 is heated up to about 1200° C. Once the high temperature chamber 101 reaches 1200° C., above the dissociation temperature of HCl gas, HCl is introduced into the downstream high temperature chamber 101. As a result of the high temperature, the HCl dissociates into reactive hydrogen (H) and chlorine (Cl) which will react with the silicon byproducts. In embodiments that utilize HCl as an etchant, the downstream RF chamber should be heated above the dissociation temperature of HCl, which is above about 1150° C. Below this temperature, it is believed that HCl will not break up the polymer.

Thus, according to one or more embodiments, the formation of polymeric exhaust deposits is prevented by heating the low frequency RF chamber to temperatures sufficient to break the bonds that form polymeric exhaust components or prevent such bonds from forming. In addition, the heating can be used to activate etchant species in the downstream RF chamber. Temperatures in excess of about 1000° C., and more typically in excess of about 1100° C., for example, between about 1100° C. and 1200° C. may be used to breaks bonds to prevent polymerization of the exhaust components and may be used to activate etchant species.

While it was previously described that polymer prevention apparatus 140 may be turned ON and OFF during specific periods of a processing procedure, the polymer prevention apparatus may also be configured as a passive device. As a passive device, when polymer prevention apparatus 140 is the downstream high temperature chamber 101 described above, the high temperature chamber 101 is supplied continuously with a sufficient RF power signal so that no special control signals or processor time need be devoted to turning the high temperature chamber 101 ON and OFF.

As previously mentioned, if configured as an active device, power is supplied to polymer prevention apparatus 140 during the time at which a chamber clean operation takes place. Optionally, RF power may also be supplied during the period in which film deposition occurs in chamber 100. Control of the timing aspects of polymer prevention apparatus 140 when configured as an active device is generally performed by processor (not shown) through the application of control signals sent over control lines.

Figure 6:
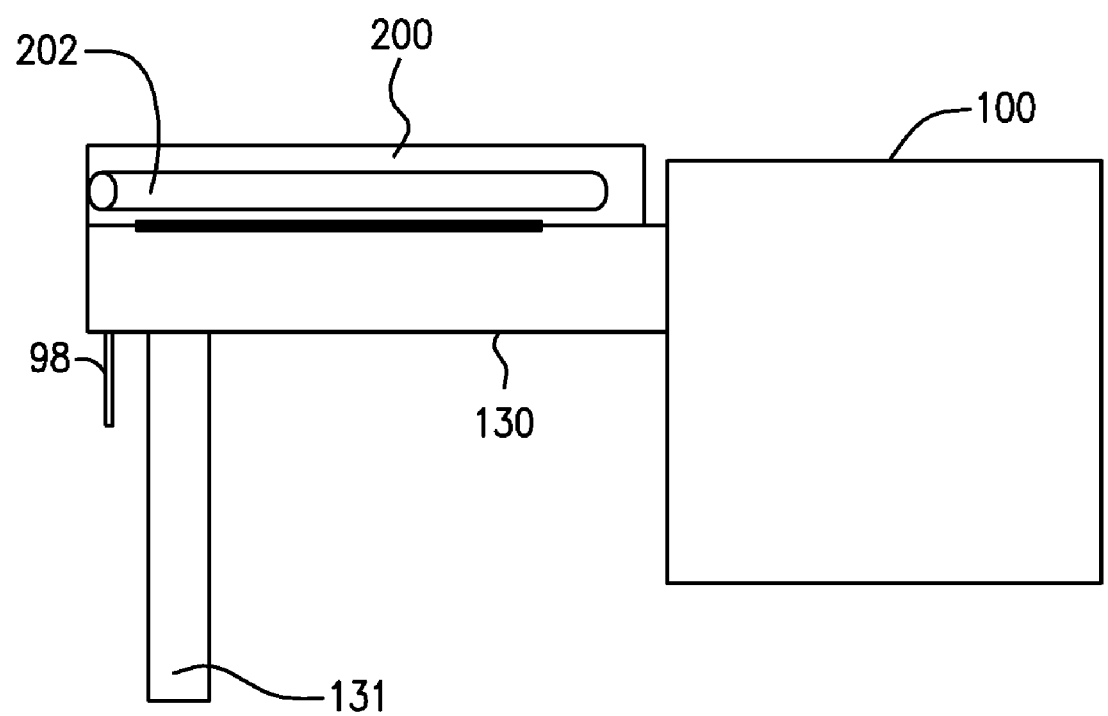
FIG. 6 is a side cross-sectional view of another embodiment of an exhaust cleaning apparatus utilizing a UV energy.
Figure 7:
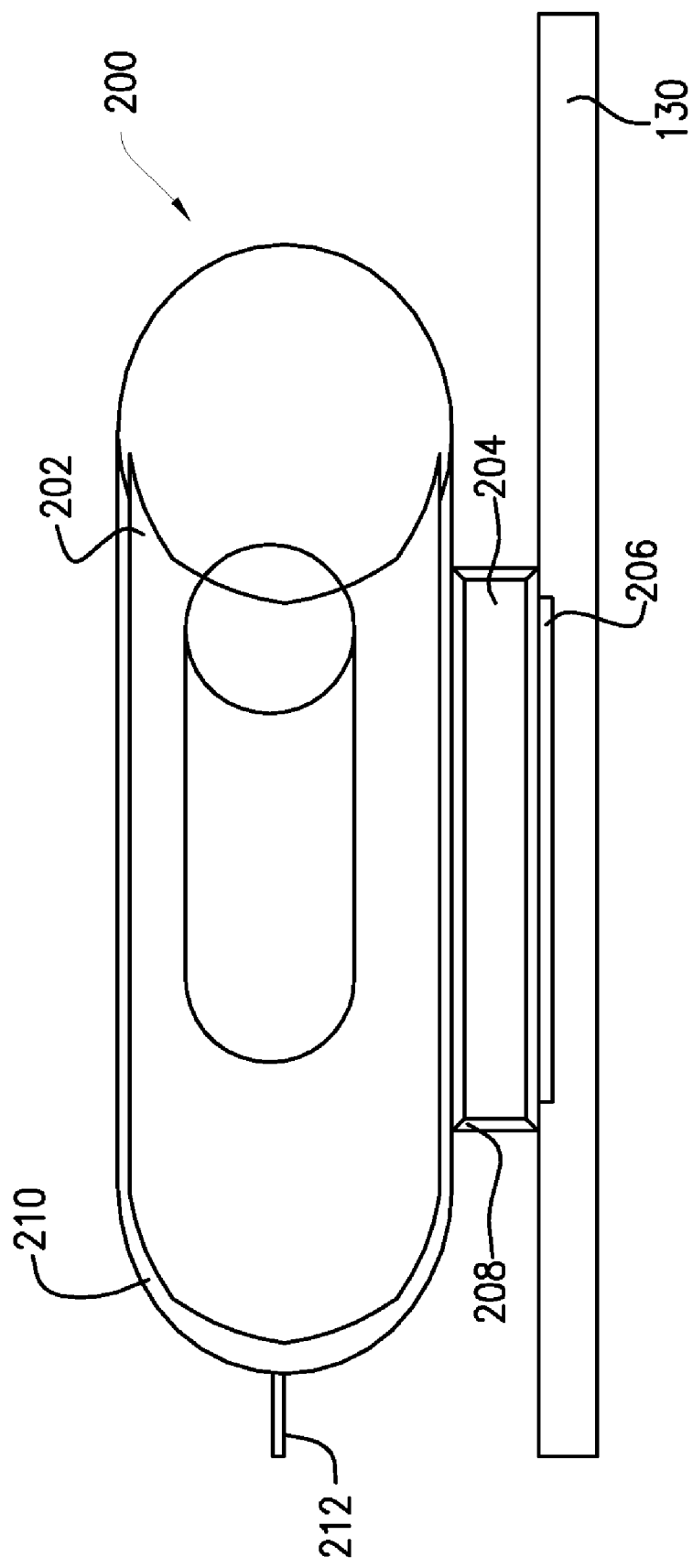
FIG. 7 illustrates an embodiment of a UV system that can be utilized with the apparatus shown in FIG. 6.

A number of alternative embodiments of the apparatus of the present invention may be constructed. The polymer prevention apparatus 140 shown in FIG. 1 above may be in the form of a vacuum UV device coupled to the exhaust cap. An exemplary embodiment of such an apparatus is shown in FIG. 6. In FIG. 7, UV device 200 is coupled to the exhaust cap 130 of the reaction chamber 100 and upstream from the exhaust line 131. It will be appreciated that the UV device 200 may be coupled to the exhaust line 131 in addition to or instead of being coupled to the exhaust cap. An inlet line may be coupled to the exhaust cap 130 or exhaust line for the addition of etchant species such as HCl, $NF_3$, $Cl_2$ and $F_2$. Etchant species can be injected into the exhaust line or exhaust cap to augment the cleaning operation.

FIG. 7 shows an embodiment of a UV device 200 that may be utilized in the embodiment shown in FIG. 7. In FIG. 7, the UV device includes a Xeradex® bulb, available from Osram Sylvania of Danvers, Mass. Alternatively, the UV source may be a lamp supplied by USHIO America, Inc. The wavelength of the bulb will depend on the type of etchant used. Suitable wavelengths include 172 nm and 124 nm when $Cl_2$ is the etchant gas. The bulb 202 may be attached to the exhaust cap at a UV window 204, which typically would be sealed with appropriate seals 206, 208 such as O-rings. Lamp enclosure 210 may include a purge valve 212 for nitrogen or other gases.

In use, UV energy generated by bulb 202 prevents formation of bonds or breaks bonds that are required to form polymer species in the exhaust line. The volatile species remain in the gas phase and our pumped through the exhaust line 131 in the gas phase. It is believed that if HCl is used as the etchant, it will be more reactive in UV light, and it augment the cleaning process. It may be desirable to further enhance the cleaning process by heating the exhaust line for at least about 3-4 feet downstream of the UV device 200.

Although the invention herein has been described with reference to particular embodiments, it is to be understood that these embodiments are merely illustrative of the principles and applications of the present invention. It will be apparent to those skilled in the art that various modifications and variations can be made to the method of the present invention without departing from the spirit and scope of the invention. Thus, it is intended that the present invention include modifications and variations that are within the scope of the appended claims and their equivalents.

What is claimed is:

1. A method of preventing the formation of polymers in the exhaust line of a CVD reaction chamber including chlorine containing gases comprising:
    flowing the chlorine containing gases exhausted from the CVD reaction chamber including byproducts containing chlorine through a downstream low frequency RF chamber which generates energy to break bonds and/or prevent bonds that form chlorosilane polymers, to prevent the formation of chlorosilane polymeric species in the exhaust line, the low frequency RF chamber operating at a frequency of less than about 20 KHz.

2. The method of claim 1, wherein the low frequency RF chamber generates and maintains temperatures between about 1000° C. and 1200° C.

3. The method of claim 2, wherein the low frequency RF chamber operates at a frequency of less than about 10 KHz.

4. The method of claim 2, further comprising generating a low pressure plasma.

5. The method of claim 4, wherein the pressure of the plasma is less than about 10 Torr.

6. The method of claim 1, further comprising introducing an etchant into the chamber.

7. The method of claim 6, wherein the etchant is selected from the group consisting of HCl and $Cl_2$.

8. The method of claim 1, wherein the downstream chamber includes a UV light source.

9. The method of claim 8, wherein the UV light source operates at a wavelength of about 172 nm.

10. The method of claim 8, wherein an etchant is introduced into the downstream chamber.

11. The method of claim 10, wherein the etchant is selected from the group consisting of HCl and $Cl_2$.

12. The method of claim 1, wherein the low frequency RF chamber comprises a helical resonator coil.

13. The method of claim 12, wherein the helical resonator coil surrounds a susceptor tube.

14. The method of claim 1, wherein the chamber is configured to generate power to the low frequency RF chamber only during the time which formation of polymers is prevented.

15. The method of claim 1, wherein the chamber is configured to continuously generate power to the low frequency RF chamber.

* * * * *